United States Patent [19]

Schantz et al.

[11] Patent Number: 4,863,760
[45] Date of Patent: Sep. 5, 1989

[54] HIGH SPEED CHEMICAL VAPOR DEPOSITION PROCESS UTILIZING A REACTOR HAVING A FIBER COATING LIQUID SEAL AND A GAS SEA;

[75] Inventors: Christopher A. Schantz, Redwood City; Ronald Hiskes, Palo Alto, both of Calif.

[73] Assignee: Hewlett-Packard Company, Palo Alto, Calif.

[21] Appl. No.: 266,276

[22] Filed: Oct. 26, 1988

Related U.S. Application Data

[63] Continuation of Ser. No. 129,880, Dec. 4, 1987, abandoned, which is a continuation of Ser. No. 635,313, Jul. 27, 1984, abandoned.

[51] Int. Cl.$^4$ .............................................. B05D 5/06
[52] U.S. Cl. ..................................... 427/163; 65/60.6; 65/60.8; 427/166; 427/248.1; 427/249; 427/255; 427/255.1; 427/255.2; 427/255.5; 427/402; 427/407.2
[58] Field of Search ................. 427/163, 166, 248.1, 427/249, 255.1, 255.2, 255.5, 255, 402, 407.2, 60.8; 65/60.6

[56] References Cited

U.S. PATENT DOCUMENTS 3,341,376 9/1967 Spenke et al. .................... 427/255.5
3,924,034 12/1975 Olcott ............................... 427/249
3,944,686 3/1976 Froberg ............................ 427/249
4,183,621 1/1980 Kao ................................. 350/96.30
4,358,473 11/1982 Debolt et al. ..................... 427/255.5
4,575,463 3/1986 Biswas et al. ..................... 427/163

FOREIGN PATENT DOCUMENTS 0163457 4/1985 European Pat. Off. ............ 427/163
0166649 2/1986 European Pat. Off. ............ 427/163
1954480 8/1970 Fed. Rep. of Germany ... 427/248.1
493302 7/1982 France ........................... 427/163
55-75945 6/1980 Japan ............................. 427/255.5

Primary Examiner—Janyce Bell
Attorney, Agent, or Firm—John A. Frazzini

[57] ABSTRACT

A CVD furnace, having a gas seal and a liquid seal, for chemical vapor deposition of a coating on a fiber. A CVD process utilizing the CVD furnace allows fibers to be pulled through the furnace without drawing gases entrained by the moving fiber into the reaction chamber of the furnace. The process is a hot fiber process, preferably deriving its heat from the meltdown point in an optical fiber pulling process. A coat containing carbon is applied by supplying a reactant containing a carbon having a triple bond. A small amount of silane is also supplied to the reaction chamber to act as an oxygen getter and to prevent tar-like reaction products from clogging the furnace.

10 Claims, 3 Drawing Sheets

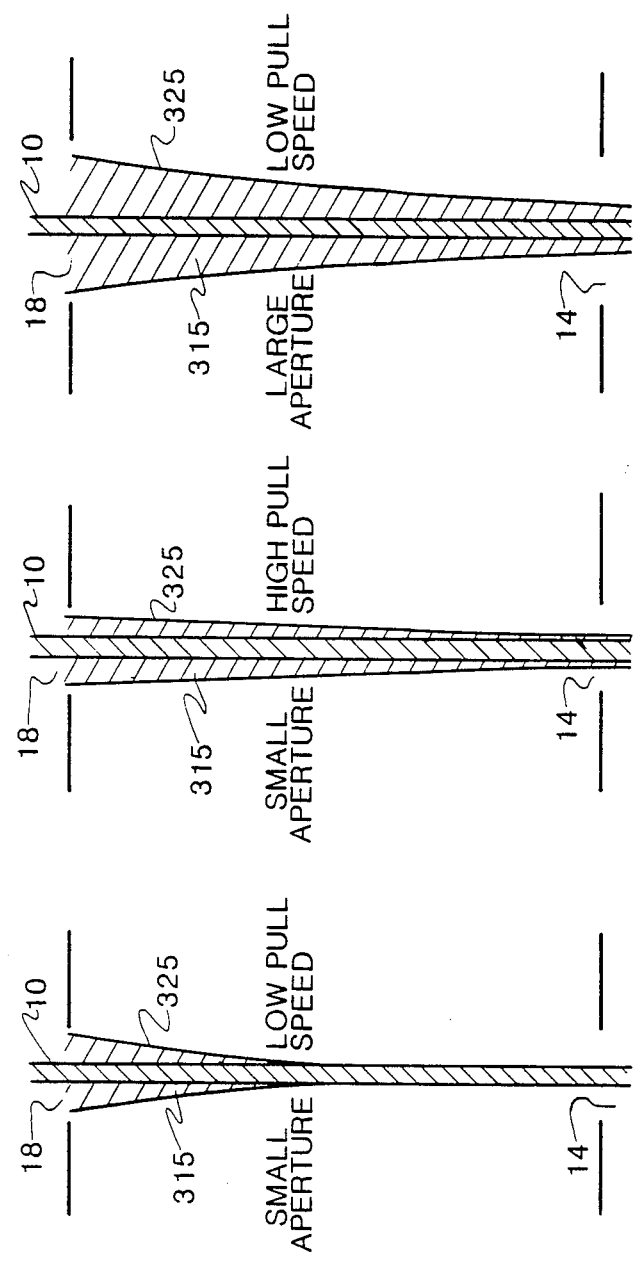

HIGH SPEED CHEMICAL VAPOR DEPOSITION PROCESS UTILIZING A REACTOR HAVING A FIBER COATING LIQUID SEAL AND A GAS SEA;

CROSS REFERENCE TO RELATED APPLICATION

This application is a continuation of application Ser. No. 129,880, filed 12-4-87, now abandoned which is a continuation of Ser. No. 635,313, filed July 27, 1984, now abandoned.

In the Figures, the first digit of a reference numeral will indicate the first figure in which that element is shown. Analogous elements in different drawings will generally have reference numerals that differ only in the most significant digit.

BACKGROUND OF THE INVENTION

The disclosed invention relates in general to fiber coatings and more particularly to a coating method and furnace suitable for applying on-line at high pull speeds a corrosion resistant hermetic coating on optical fibers. It is well known that bare uncoated optical fibers are susceptible to corrosion by various chemicals, including water. Cracks and scratches in the fiber surface present regions susceptible to chemical attack, especially when the fiber is under stress. Therefore, optical fibers are typically coated with an abrasion resistant coating to prevent scratching the fiber. However, the optical fiber surface typically contains microcracks, produced during manufacture of the fiber, that can also be attacked by water. Therefore, to prevent sudden breakage of a fiber due to attack by water, it is important in many applications to apply a hermetic coating to the fiber. The hermetic coating as well as an abrasion resistant coating must be applied on-line as the fiber is being pulled so that the fiber is protected before it is wound onto a take-up spool. Therefore, a process is required that can deposit hermetic and abrasion resistant coatings at fiber pulling speeds appropriate for producing production volumes of optical fiber—namely, at speeds on the order of 1–10 meters per second.

In borehole logging operations using optical fiber, the optical fiber can be exposed to water at up to 200 degrees Centigrade and 20,000 psi. In addition, the weight of the instruments attached to the optical fiber and the weight of the metal cables used to support the instruments results in up to a 3% strain in the metal cables and in the optical fibers. Under such temperature, pressure and strain, it has been found that an uncoated fiber breaks within seconds. Therefore, a hermetic coating is needed that can protect an optical fiber under these hostile conditions.

In U.S. Pat. No. 4,512,629 entitled OPTICAL FIBER WITH HERMETIC SEAL AND METHOD FOR MAKING SAME, issued to Eric G. Hanson, et al on Apr. 23, 1985, a coating containing silicon and carbon is presented that has proven to be a hermetic coating under the hostile conditions experienced by an optical fiber in borehole logging. As indicated in that application, the addition of silane ($SiH_4$) to the carbon source reactants increases the reaction rate resulting in a thicker coating than without the addition of silane. However, a chemical resistance test in which a fiber is immersed in hydrofluoric acid indicates that as the amount of silicon in the coating is reduced, the chemical resistance increases. Also, fast fracture tests indicate that there is a small increase in fiber strength as the amount of silicon in the coating is decreased. However, the reduction of the fraction of silane in the reactants reduces the thickness of the resultant coating. As indicated in U.S. Pat. No. 4,512,629, it was found that the elimination of $SiH_4$ resulted in a coating that was not hermetic. It has been speculated that the coating was not hermetic because it was too thin. Therefore, a method and furnace are needed that can produce extremely high deposition rates so that the amount of silicon can be reduced without unduly reducing the thickness of the resultant coating. Such a method should enable the on-line deposition of pinhole-free, strongly bonded coatings on optical fibers at commercial pulling speeds. The order of magnitude increase in the pulling speed for a production process requires that a process be found that has more than an order of magnitude increase in the rate of deposition of carbon on an optical fiber compared to the method disclosed in U.S. Pat. No. 4,512,629.

In FIG. 1 is shown a CVD furnace suitable for use in coating optical fibers. That chamber is disclosed in Japanese patent application No. 54-151947 which was laid open on June 7, 1980 in publication 55-75945. That CVD furnace has a reaction chamber 11 that has a reactant inlet 12 and an exhaust port 13. That furnace also has a fiber inlet 14 and a fiber outlet 15 for passage on-line of an optical fiber 10 through the reaction chamber. In order to prevent reactant gases from escaping through the fiber inlet or the fiber outlet, gas seals 16 and 17 are located at the fiber inlet and at the fiber outlet. Seals 16 and 17 respectively have inlets 111 and 112 through which an inert gas is supplied and have apertures 18 and 19 through which the fiber is pulled. Gas seals are utilized as the seals at the fiber inlet and the fiber outlet to avoid scratching and/or contaminating an optical fiber due to passage through the seals. Although the particular embodiment shown in FIG. 1 utilizes heating coils 110 to heat the walls of reaction chamber 11 for a hot wall CVD process, the specification also indicates that other methods of heating can be used including rf heating, laser heating of the fiber or placing the reaction chamber near enough to the meltdown point at which the fiber is pulled from the preform that the fiber is hot enough for a cold wall, hot fiber CVD coating process to take place.

Unfortunately, the use of gas seals at both ends of the reaction chamber draws into the reaction chamber ambient gases entrained by the moving fiber. The problems arise primarily at aperture 18 in gas seal 16. When a fiber is pulled through the reaction chamber, a layer of ambient gases at the surface of the fiber is drawn through gas seal 16 into the reaction chamber. At low speeds with a sufficiently long gas seal 16, this layer of air has time to diffuse away from the fiber before the fiber enters the reaction chamber so that only a negligible amount of ambient gases is drawn into the reaction chamber. However, in many applications, the top seal 16 is not long enough to remove the entrained gases before the fiber traverses the entire gas seal. Therefore, a method of deposition is needed which prevents an unacceptable amount of ambient gases from being drawn into the

SUMMARY OF THE INVENTION

The fiber coating process is a hot fiber, cold wall chemical vapor deposition (CVD) process in which the heat for the CVD reaction is provided by a hot fiber rather than by hot reactant gases. In hot reactant gas coating processes, the heat is typically supplied by heating coils that heat the walls of a CVD reaction chamber. Such a hot wall process has several disadvantages. Because the walls are the hottest part of the reaction chamber, much of the coating process occurs on the walls, thereby producing a coating on the walls that reduces heat conduction into the chamber and that can flake off the walls and deposit unwanted particles on the fiber.

Of even greater importance, it has been determined that a hot fiber CVD process produces better coats having fewer defects, pinholes and particulates adhering to the coating than does a hot wall CVD process. It is theorized that the hot fiber creates a thermal gradient that produces a pressure gradient, directed away from the fiber, on particles in the gases in the reaction chamber. This type of pressure gradient is known as thermophoresis. As a result of this pressure gradient, particles in the reaction chamber are prevented from drifting to and depositing on the hot fiber. This gradient prevents particles that have been produced by a CVD reaction away from the surface of the hot fiber or have flaked off the walls from depositing on the fiber.

In a preferred embodiment of the hot fiber process, the elevated temperature of the fiber is achieved by placing the reaction chamber sufficiently close to the meltdown point (i.e., the point at which a preform is heated to a sufficient temperature that a fiber can be drawn from the preform) that the fiber has not yet cooled below the temperature required for the CVD reaction. Because the meltdown point is at a relatively high temperature, many CVD processes can be performed utilizing this source of heat. By use of this source of heat, the additional cost and complexity of a second heat source to heat the fiber are avoided. In addition, such methods as rf heating and laser heating as suggested in the above-cited Japanese application No. 54-151947 are not particularly suitable for heating an optical fiber because the fiber is very thin, non-conductive and transparent. A further advantage of utilizing the heat from the meltdown point is that the fiber is not subjected to stresses which occur when the freshly drawn fiber is allowed to cool before being reheated to temperatures suitable for the CVD reaction. Also, the freshly drawn fiber presents a pristine surface that likely has some unformed bonds that will increase the bonding strength of a coating applied near the meltdown point.

This hot fiber CVD process utilizes a reaction chamber having an air seal on one end and a liquid seal on the other end. The reactants supplied to the reaction chamber are selected to deposit a hermetic coating on the fiber. In one embodiment used to produce fiber having an abrasion coating of silicone outside of the hermetic coating, liquid silicone is utilized as the liquid in the liquid seal. Clearly other coatings that are applied as a liquid could also be utilized in the liquid seal.

The use of at least one liquid seal is important in enabling high pulling speeds (on the order of 10 m/s) to be implemented. When a gas seal is utilized at both ends of the reaction chamber, as in the embodiment shown in FIG. 1, it is very difficult to prevent the ambient atmosphere from being drawn by the moving fiber into the reaction chamber. Even with flow controllers controlling the flow of gas across inlets 12, 111 and 112 and across exhaust port 13, an increase in gas flow into reaction chamber 14 caused by entrainment of ambient gases across aperture 18 is compensated for by an increase in gas flow across aperture 19. This tends to let part of the ambient gases entrained by the moving fiber be drawn across the entire air seal as illustrated by comparison of FIG. 3B with FIG. 3A. In FIGS. 3A–3C lines 325 are the locus of points at which gas flow is zero and hatched region 315 represents gases moving downward with the fiber. The fiber in FIG. 3B is pulled at a higher speed than the fiber in FIG. 3A so that the entrained gases are carried farther in FIG. 3B. Thus, an increase in fiber pull speed will increase the amount of gas carried by the fiber across aperture 18 and, for high pull speeds, will carry ambient gases into the reaction chamber. For many CVD processes in which the ambient gas is air, the amount of oxygen drawn into the reaction chamber by the moving fiber significantly degrades the coat deposited by the CVD reaction.

On first consideration, it would appear that the ambient gases can be prevented from entering the reaction chamber by increasing the length of gas seal 16 to increase the time of passage of the fiber through seal 16, thereby increasing the time in which the entrained air can diffuse away from the fiber and be carried away in the inert gas flowing out of aperture 18. However, in a hot fiber process in which the elevated temperature is achieved by placing the reaction chamber near the meltdown point, the reaction chamber must be near the meltdown point, thereby limiting the length of the top seal. For a 1 meter per second pull speed, the reaction chamber must be on the order of fifteen centimeters from the meltdown point. Also, to prevent damage to gas seal 16, that seal cannot be too close to the meltdown point. These constraints limit the length of the top seal to a value that is inadequate to prevent the moving fiber from drawing ambient gases into the reaction chamber. It can be seen as follows that this problem occurs over a wide range of speeds in a hot fiber process utilizing the heat from the meltdown point. In such a process, the rate of fiber cooling is roughly independent of pulling speed so that for a given reaction temperature the reaction chamber should be a distance from the meltdown point that increases substantially linearly with pull speed. However, the characteristic distance entrained ambient air is carried by the fiber also increases substantially linearly with pull speed so that the problem of entrained air is roughly independent of pull speed.

It would also seem that the rate of flow of inert gas into gas seal 16 through inlet 111 could be increased and/or the diameter of aperture 18 could be decreased sufficiently that the rate of flow of inert gas through aperture 18 produces a shear flow past the fiber sufficient to srip the entrained ambient gas layer from the fiber before the fiber enters the reaction chamber. However, in accordance with the Bernoulli equation, the relative motion between the fiber and the inert gas flowing through aperture 18 produces a force on the fiber that tries to draw the fiber toward the edge of the aperture. To prevent the fiber from being drawn to the edge of the aperture and scratched by the resultant contact with the wall of seal 16, tension must be applied to the fiber sufficient to produce a restoring force toward the center of aperture 18 greater than the force toward the edge of aperture 18. Unfortunately, an increase in tension on the fiber needed to offset an increase in the Bernoulli force increases the amount of surface defects in the fiber. Therefore, the entrained air cannot be stripped from the fiber simply by reducing the diameter of aperture 18 and/or increasing the flow rate of inert gas through inlet 111. To provide more room for fiber vibration without contact between the fiber and the perimeter of aperture 18, the aperture diameter can be increased. However, as shown in FIG. 3C, this diameter increase also increases the amount of entrained gas and therefore counters the benefit of increasing the flow rate of inert gas through inlet 111.

liquid seal is advantageous because it prevents the moving fiber from drawing gases past it. Typically, in an optical fiber coating process, the top seal should be a gas seal to avoid scratching or chemically reacting with the hot, freshly drawn fiber. However, the bottom seal can be a liquid if the CVD coating is not scratched or chemically attacked by the liquid in the seal.

In a CVD chamber utilizing two gas seals as in FIG. 1, the increase in gas flow into reaction chamber 11 caused by entrained gas through aperture 18 is compensated for by an increase in gas flow across aperture 19 due to entrained gas. In contrast to this, when at least one of the two seals is a liquid seal, gas cannot be transported across that seal to compensate for a change in gas flow acrosss the other seal. In a system having one gas seal and one liquid seal, a change in speed will briefly change the rate of flow of gas across the aperture of the gas seal, but with the flow of gas across the other entrances and exits from the system controlled by flow controllers, the brief change in gas flow rate will produce a pressure change in the reaction chamber and in the gas seal sufficient to re-establish the previous rate of gas flow across the gas seal aperture. This pressure change counters the tendency of a more rapidly moving fiber to carry ambient gases across the gas seal.

In a hot fiber CVD process for depositing a carbon or carbon containing coating on the optical fiber, it has been observed that a peak in the reaction rate occurs at a temperature $T_m$ between the meltdown temperature and typical room temperature. As a result of this, it has been observed that substantially all of the coating is deposited while the fiber is within a relatively small temperature range about $T_m$. For a CVD coating process using the reactant methyl acetylene, $T_m$ is on the order of 1400 degrees Centigrade. At a one meter per second pull speed in a system utilizing the heat of the meltdown point as the source of heat for the hot fiber, the coating occurs within a region of the reaction chamber less than a few centimeters long. An increase in pull speed will not significantly affect the thickness of the deposited coating as long as the reaction chamber encloses the entire distance over which substantially all of the deposition takes place. In such a CVD process for depositing a carbon coating on the fiber, it has been determined that the carbon coating is typically too thin to be hermetic.

As discussed in the Background, it is advantageous to have a coating method that deposits a carbon coating of sufficient thickness to be hermetic. To achieve a rapid enough rate of deposition of carbon it has been found to be necessary to utilize a carbon source containing a triple bonded carbon atom. Acetylene can be used, but because pure acetylene will decompose in a supply line at above 15 pounds per square inch, acetylene typically is supplied in bottles containing acetone. The amount of acetone supplied to the reaction chamber with the acetylene is large enough that it can adversely affect the resultant coating. Methyl acetylene has therefore been found to be a preferred choice of a triple bonded source of carbon.

A small amount of an oxygen getter should be included in the reactant gases to bind the small amount of oxygen that is released by the optical fiber during CVD coating or that is drawn into the reaction chamber across the gas seal. A particularly useful choice of an oxygen getter is silane because it not only has a high affinity for oxygen, but it also prevents clogging of the system by tar-like reaction products. When the only reactant is methyl acetylene, a tar-like coating deposits on the walls of the reaction chamber. Because of the thermophoresis effect, this reaction product does not deposit on the fiber, but it does deposit on the walls of the reaction chamber requiring frequent time-consuming dismantling and cleaning of the reaction chamber. Of even greater importance, these reaction products can produce in even a single run a thick enough deposit near the fiber inlet and near the reaction chamber exhaust port that gas flow is disrupted, causing the fiber to be scratched by brushing against the edges of the fiber inlet. In addition, the deposits can be thick enough that the diameter of the fiber inlet is reduced sufficiently, or the deposits near the exhaust port are large enough, that the fiber is scratched by coming into contact with one or the other of these deposits. The presence of a small amount (about 2% by reactant volume) of silicon containing reactant, such as silane, results in the reaction product being converted to a light powder that is kept away from the fiber by thermophoresis and is more easily evacuated through the reaction chamber exhaust port.

DESCRIPTION OF THE FIGURES

FIGS. 3A-3C show the effect of fiber pulling speed and gas seal aperture diameter on the ambient gas entrained by a moving fiber.

DESCRIPTION OF THE PREFERRED EMBODIMENT

Figure 2:
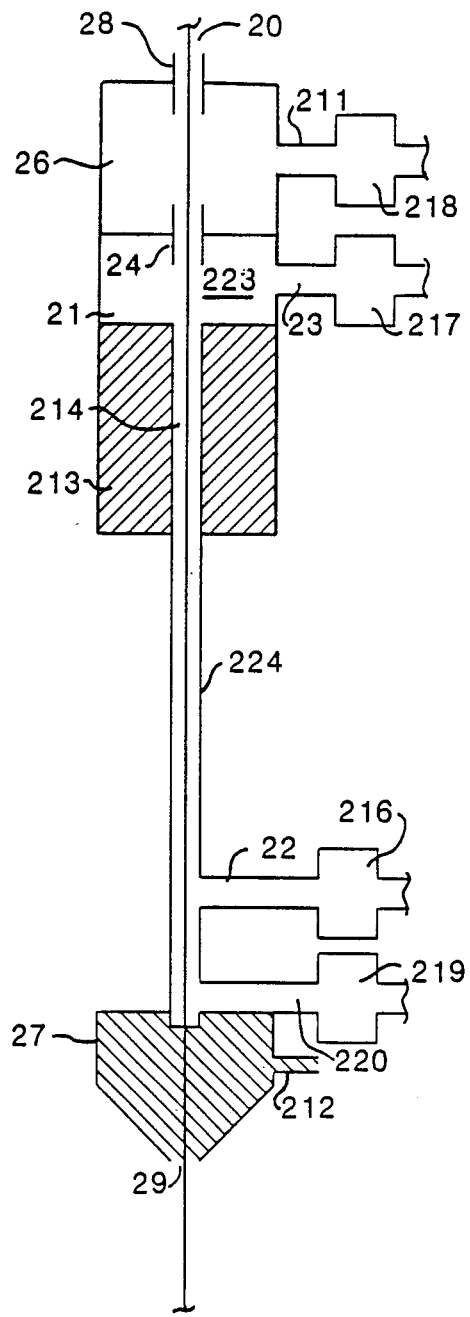
FIG. 2 shows a cross-section of a CVD furnace utilizing one gas seal and one liquid seal.

In FIG. 2 is shown a cross-section of a chemical vapor deposition furnace suitable for on-line deposition of a coating on a fiber 20 and in particular for depositing a carbon coating on an optical fiber at high pull speeds. In the case of an optical fiber, the fiber is pulled on-line through the CVD furnace so that the fiber is protected by a deposited coating before it is wound onto a take-up reel. The furnace includes a reaction chamber 21, each end of which is terminated by one of a pair of seals 26 and 27. The reaction chamber has a reactant inlet 22 and an exhaust port 23. A set of fiber apertures 24, 28 and 29 in seals 26 and 27 enable the fiber to be pulled on-line through the reaction chamber for chemical vapor deposition of a coating.

The reaction chamber is oriented vertically with gas seal 26 at the top so that the weight of the fiber does not produce sag (as it would in a horizontal deposition process) that would tend to bring the fiber into contact with the walls defining apertures 24, 28, and 29. The top seal is a gas seal 26 having an inlet 211 for entrance of a relatively inert gas (e.g., $N_2$). The bottom seal is a liquid seal 27 having an inlet 212 for supply of a liquid into the seal. Most of the reaction chamber is filled with a vacuum bottle 213 that produces a cylindrical channel 214 about fiber 20. The diameter of the channel is on the order of 3 millimeters. The narrowness of the channel ensures that the reactant gas or gases pass through the reaction chamber in close proximity to the fiber so that they will effectively react with the fiber in a cold wall, hot fiber process. In an alternative embodiment, in order to better preserve cylindrical symmetry of the system, each of the inlets and the exhaust port are connected to cylindrical gas transport channels that supply or exhaust gases from the furnace in a cylindrically symmetric manner. Also, to keep the reactant gases from interacting with the liquid in seal 27, inert gas is also supplied through an additional inert gas inlet 220 located just above the surface of the liquid in seal 27.

For deposition on optical fibers, the process is preferrably a cold wall, hot fiber process so that a temperature gradient is created that, by thermophoresis, produces a pressure gradient on particles in the reaction chamber that prevents these particles from depositing on the fiber. The fiber is pulled from a preform located vertically above the furnace. An rf heater operating at about 2300 degrees Centigrade heats the bottom of the preform at a meltdown point. The fiber is pulled on-line through the reaction chamber for CVD deposition of a coating. The elevated temperature of the fiber is produced by placing the furnace close enough to the meltdown point that the fiber is still hot enough during entrance into reaction chamber 21 that chemical vapor deposition occurs on the surface. Vacuum bottle 213 decreases the rate of cooling, thereby increasing the time interval during which the fiber temperature is within the temperature range in which significant CVD coating occurs.

For deposition at fiber pulling speeds above 1 meter per second of a carbon coating of sufficient thickness that a hermetic coating is produced, a very rapid coating process is required. In general, the reactant should be a carbon source containing at least one triple bonded carbon. Acetylene has been found to react fast enough, but because of the need to store acetylene in a bottle containing acetone, it is preferred to use methyl acetylene. This latter carbon source avoids the introduction of some acetone into the reaction chamber The presence of acetone is disadvantageous because it provides oxygen that can be incorporated into the fiber coating For the process utilizing methyl acetylene, the deposition occurs substantially only while the fiber is in a temperature range between 800 and 1400 degrees Centigrade. At 1 meter per second pull speed, the fiber cools through this range over a few centimeters of travel in the reaction chamber. It is important that the reaction chamber be close enough to the meltdown point that the fiber is within this range during its passage through the reaction chamber Preferrably, the fiber should be in this range while the fiber is within channel 214. This requires that the top of channel 214 be about 15 centimeters or less from the meltdown point for a 1 meter per second pull speed process. To keep the top of gas seal 26 far enough from the meltdown point that it is undamaged by the high temperature produced at the meltdown point, the lengths of gas seal 26 and of the region 223 of the reaction chamber in the vicinity of exhaust port 23 should each be about 2 centimeters.

Figure 1:
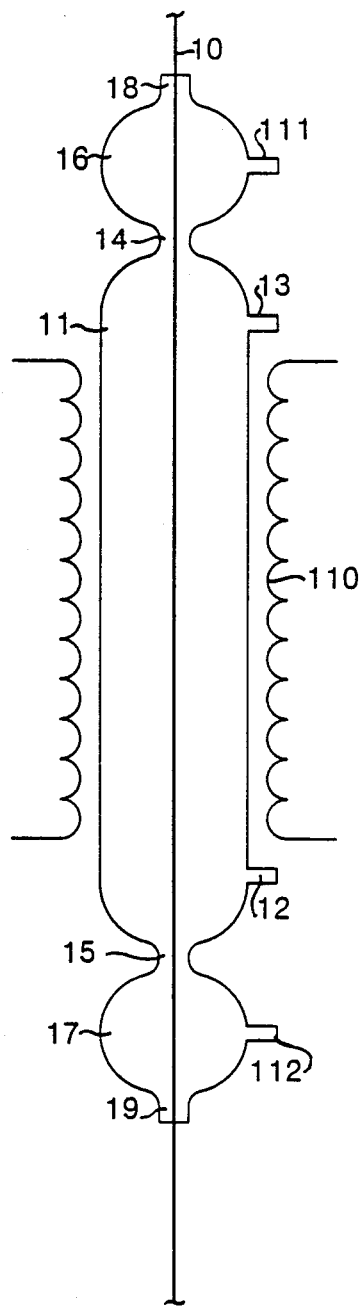
FIG. 1 shows a cross-section of a prior CVD furnace utilizing a pair of gas seals.

Seal 27 is selected to be a liquid seal so that entrained ambient gases are prevented from being drawn into reaction chamber 21 by the moving fiber. Mass flow controllers 216, 217, 218 and 219 control the flow of gases through inlet 22, exhaust port 23, inert gas inlet 220 and inlet 211, respectively. The amount of gas flowing from seal 26 through aperture 24 into the reaction chamber is equal to the difference between the flow trough controller 217 and the sum of the flows through controllers 216 and 219. Similarly, the flow of gas through aperture 28 is the difference between the flow through controller 218 and through aperture 24. Therefore, the net average flow of gas through apertures 24 and 28 is determined by flow controllers 216-219. It should be noted that this is true independent of the fiber pulling speed. This contrasts with the system in FIG. 1 in which the extra degree of freedom added by aperture 19 in the bottom gas seal prevents the flow through aperture 18 from being determined by control of the flow through exhaust port 13 and through inlets 12, 112 and 113. Changes in velocity of the fiber produce brief changes in the flow rate through aperture 28, but such brief changes alter the pressure in the gas seal to reestablish the flow rates dictated by the flow controllers. Thus, the flow rate through aperture 28 is insensitive to the velocity of the fiber. This is important in establishing the ability to prevent the entrainment of ambient gases into the reaction chamber at pull speeds above 1 meter per second. In addition, it is important in producing uniform coats because the fiber pull speed typically varies by up to 30% to maintain a constant fiber diameter in spite of variations in the preform. This improved blockage of entrained ambient gases enables the use of a larger aperture 28 (greater than 3 millimeters diameter) than aperture 18 (on the order of 0.3-1 millimeter diameter) in the two gas seal furnace of FIG. 1.

When a buffer coating of silicone is desired outside the hermetic coating, the liquid in the bottom seal should be silicone. When this is the case, the fiber should be allowed to cool sufficiently that the resultant silicone coat is not adversely affected by temperature of the fiber. This requires that the fiber cool after passage through channel 214 in which the CVD reaction takes place. To achieve this cooling, an uninsulated portion 224 of the reaction chamber is included below insulating bottle 213. In a 1 meter per second process utilizing silicone as the liquid in the bottom seal, the length of the uninsulated portion 224 should be on the order of 0.75 meters. The use of a triple bonded carbon source increases the reaction rate enough that a diluent gas needs to be supplied with the carbon source reactant. Preferably, the diluent is helium or hydrogen so that the small atomic weight of the diluent gases increases their velocity, thereby increasing the thermal conductivity of the reactant gases to more effectively heat the reactant gases by the hot fiber. For a 1 meter per second pull speed coating process, methyl acetylene is supplied through inlet 22 at 0.6 liters per minute. Either $H_2$ or He diluent is supplied through inlet 220 at 0.6 liters per minute to dilute the reactant gas and to prevent the reactant gas from interacting with the liquid in seal 27. $N_2$ is supplied through inlet 211 at 1 liter per minute and gases are exhausted through exhaust port 23 at 1.5 liters per minute so that a net flow of 0.7 liters per minute out through aperture 28 is achieved.

In the CVD process utilizing methyl acetylene, entrained air drawn in with the fiber should be excluded from reaching the exhaust port to avoid the risk of producing an explosive mixture. In CVD processes in which air can be allowed to reach the exhaust port, then gas seal 26 can be eliminated from the reaction chamber. In such a situation, region 223 near the exhaust port functions as a gas seal. The upward flow of gases in narrow channel 214 excludes this air from penetrating into channel 214. Therefore, channel 214 is a region in which the CVD reaction can take place without being affected by the entrained air. For example, in a process of depositing silicon nitride on an optical fiber, silane and ammonia reactants are supplied through reactant inlet 22. Because air is excluded from channel 214, silicon nitride is deposited in that region. In region 223, the oxygen in the air drawn into region 223 reacts with the silane to produce a powder that does not deposit on the fiber and is exhausted through exhaust port 23. As a result of this, the oxygen drawn into region 223 shuts down the CVD process in that region.

We claim:

1. A chemical vapor deposition (CVD) process for coating a fiber, said process comprising the steps of:
    pulling said fiber through a first seal and second seal of a CVD furnace comprising a reaction chamber wall enclosing a reaction chamber in which chemical vapor deposition is to take place, said reaction chamber wall having a plurality of openings including a reactant inlet for entry of reactants to provide reactant gases within said reaction chamber, and exhaust port for removal of gases from said reaction chamber, and a pair of fiber apertures through which said fiber can be pulled said first seal being located at a first of these two apertures to allow entry to the fiber into the reaction chamber and said second seal being located at a second of these two apertures to allow exit of the fiber from the reaction chamber, wherein a first of these seals is a gas seal and a second of these is a liquid seal;
    injecting at least one reactant gas through said reactant inlet.

2. A CVD process as in claim 1 wherein the gas seal has a fiber inlet through which the fiber is pulled into the reaction chamber;
    wherein the rate of flow of gases across all openings in the chamber other than the fiber inlet are controlled so that the flow of gas across the fiber inlet is determined.

3. A CVD process as in claim 1 wherein the liquid seal contains a liquid that is to be applied on top of the coat deposited in the CVD reaction chamber to form an additional coat on the fiber.

4. A CVD process as in claim 1 wherein the process is a cold wall, hot fiber process.

5. A CVD process as in claim 4 wherein the fiber is an optical fiber that is pulled from a preform that is heated at a meltdown point located at a distance from the reaction chamber such that, while the optical fiber passes through the reaction chamber the fiber has a temperature suitable for CVD reaction in the reaction chamber.

6. A CVD process as in claim 4 in which the reactants include a carbon source having a triple bond at a carbon atom.

7. A CVD process as in claim 6 wherein the carbon source is selected from the set consisting of acetylene and methyl acetylene.

8. A CVD process as in claim 1 wherein the reactant gases include a carbon source and an oxygen getter.

9. A CVD process as in claim 8 wherein the oxygen getter is silane.

10. A CVD process as in claim 6 wherein the reactants further include a silicon source in sufficient quantity to prevent a tar-like coating of reaction products from depositing on the reaction chamber wall.

* * * * *

UNITED STATES PATENT AND TRADEMARK OFFICE
CERTIFICATE OF CORRECTION

PATENT NO. : 4,863,760
DATED : September 5, 1989
INVENTOR(S) : Schantz et al.

It is certified that error appears in the above-identified patent and that said Letters Patent is hereby corrected as shown below:

On the title page, "HIGH SPEED CHEMICAL VAPOR ......GAS SEA;" should read --- HIGH SPEED CHEMICAL VAPOR DEPOSITION FIBER COATING PROCESS UTILIZING A REACTOR HAVING A LIQUID SEAL AND A GAS SEAL ---;

Column 2, Line 63, "drawn into the" should read --- drawn into the reaction chamber. ---;

Column 5, Line 8, "liquid seal" should read --- A liquid seal ---;

Column 7, Line 41, "chamber The" should read --- chamber. The ---;

Column 7, line 43, "coating" should read --coating--

Column 10, line 19, "for CVD" should read --for producing a desired CVD--;

Column 4, line 52, "srip" should read --strip--

Signed and Sealed this

Seventeenth Day of December, 1991

Attest:

HARRY F. MANBECK, JR.

*Attesting Officer*              *Commissioner of Patents and Trademarks*